United States Patent
Atkins et al.

(10) Patent No.: US 7,492,556 B2
(45) Date of Patent: Feb. 17, 2009

(54) QUENCH PROTECTION CIRCUIT FOR A SUPERCONDUCTING MAGNET

(75) Inventors: Andrew Farquhar Atkins, Nr Branbury (GB); Marcel Jan Marie Kruip, Oxford (GB)

(73) Assignee: Siemens Magnet Technology Ltd., Witney (GB)

( * ) Notice: Subject to any disclaimer, the term of this patent is extended or adjusted under 35 U.S.C. 154(b) by 0 days.

(21) Appl. No.: 11/281,678

(22) Filed: Nov. 18, 2005

(65) Prior Publication Data

US 2006/0176132 A1  Aug. 10, 2006

(30) Foreign Application Priority Data

Feb. 4, 2005  (GB) ................... 0502321.3

(51) Int. Cl.
*H02H 9/00* (2006.01)
(52) U.S. Cl. ....................................................... 361/19
(58) Field of Classification Search ................... 361/19
See application file for complete search history.

(56) References Cited

U.S. PATENT DOCUMENTS

| | | | | |
|---|---|---|---|---|
| 3,982,153 | A * | 9/1976 | Burdick et al. ................. | 315/8 |
| 4,348,710 | A * | 9/1982 | Woods ........................ | 361/141 |
| 4,812,796 | A | 3/1989 | Ries | |
| 5,278,380 | A * | 1/1994 | Lowry ........................ | 219/635 |
| 5,627,709 | A * | 5/1997 | Salasoo ........................ | 361/19 |
| 6,166,619 | A * | 12/2000 | Baiatu et al. ................. | 338/61 |
| 6,335,851 | B1 * | 1/2002 | Nishidai et al. ............... | 361/58 |
| 6,646,836 | B2 * | 11/2003 | Yoshikawa .................... | 361/19 |
| 6,717,781 | B2 * | 4/2004 | Xu et al. ........................ | 361/19 |
| 6,958,893 | B2 * | 10/2005 | Yuan ........................... | 361/19 |
| 6,984,543 | B2 * | 1/2006 | Mihara et al. ................. | 438/55 |
| 7,116,535 | B2 * | 10/2006 | Huang .......................... | 361/19 |
| 2003/0021074 | A1 * | 1/2003 | Yuan et al. ................... | 361/117 |
| 2006/0158795 | A1 * | 7/2006 | Tsuchiya et al. ............. | 361/19 |

FOREIGN PATENT DOCUMENTS

| | | | |
|---|---|---|---|
| DE | 3204875 C | * | 2/1985 |
| EP | 0415710 A2 | | 8/1990 |
| EP | 0 415 710 A2 | | 3/1991 |
| EP | 0489291 A2 | | 11/1991 |
| EP | 0 489 291 A2 | | 6/1992 |
| GB | 1122368 A | | 7/1967 |
| GB | 1 112 368 | | 8/1968 |

OTHER PUBLICATIONS

British Search Report.

* cited by examiner

*Primary Examiner*—Michael J Sherry
*Assistant Examiner*—Ann T Hoang
(74) *Attorney, Agent, or Firm*—Crowell & Moring LLP

(57) ABSTRACT

A quench protection circuit for a superconducting magnet, comprises at least one heater associated with a corresponding coil of the superconducting magnet. The at least one heater is arranged to be driven by an inductor which is connected in series with it and is arranged to derive a voltage from variation in a magnetic field of the superconducting magnet. The at least one heater and the inductor are arranged in a series circuit which further comprises a non-linear positive temperature coefficient resistors.

6 Claims, 1 Drawing Sheet

QUENCH PROTECTION CIRCUIT FOR A SUPERCONDUCTING MAGNET

BACKGROUND OF THE INVENTION

This invention concerns a protection circuit for a superconducting magnet. In particular, it relates to a protection circuit for protecting the superconducting magnet from damage which could otherwise occur during a quench. A quench occurs when a superconductor, such as used in superconducting magnets, reverts to a resistive state. This may be caused by localized heating in one part of the superconductor. A small part of the superconductor ceases to be superconductive, and enters a resistive state. Any current flowing through the resistive part will cause local Joule heating. This will cause the adjacent parts of the superconductor to quench, resulting in a larger resistive volume, in turn causing further Joule heating. Very rapidly, the superconductor enters a resistive state, with a potentially very large current still flowing.

Prior to the quench, coils hold a large stored energy, which may be in the order of mega joules. Following quench, this will be dissipated in the resistive volume of the conductor. If the quench process is not adequately managed, this energy can be dissipated in confined areas, resulting in local temperature rises which can damage the coil areas at or near the part where the quench was initiated.

It is known that harmful concentration of heat may be avoided by spreading the quench process, so that the resulting heat is dissipated over as much of the available superconductor as possible. This will result in a quench involving substantially the whole of the superconductor, meaning that no part should reach a dangerous temperature. In a superconducting magnet, such as those used in MRI or NMR imaging systems, this is typically achieved by deliberately initiating a quench on the superconductor coils, other than then the coil where the quench started. The deliberate quench initiation is typically achieved by applying a current to heaters, which are in close thermal contact to the coils. Typically, each coil will be fitted with two or more heaters.

FIG. 1 shows a circuit diagram of a known quench protection circuit, suitable for installation in superconducting magnets of MRI or NMR imaging systems. A superconducting magnet 10 is represented, comprising coils L1-L6 connected in series. Each of these coils has a corresponding heater R1-R6 in intimate thermal contact. This may be achieved by gluing the heaters on the surface of the coils. The heaters are electrically connected in series, and this series arrangement is connected in parallel with a subset L2-L5 of the superconductor coils. Current injection leads 12 are provided, one to each end 14, 16 of the series connection of superconducting coils. The ends 14, 16 of the series of superconducting coils are connected to a cryogenic switch 18.

All superconducting magnets which are operated in the so-called persistent mode have a cryogenic switch. Essentially, it is a piece of superconductor wire, in series with the magnet coils, with a heater attached to it. If the heater is on, the cryogenic switch 18 is normally conducting and is open. When the system is attached to an external power supply by leads 12, current will flow through the superconducting coils 10, with only a trickle running through the cryogenic switch 18. When the magnet system is 'ramped' to the required current, the heater is turned off, and the cryogenic switch 18 becomes superconducting: the cryogenic switch is closed. As the external power supply connected to leads 12 is ramped down, the current through the cryogenic switch 18 will increase by the same amount as the decrease in the current through the external power supply. Once the external power supply is ramped down completely, the current leads 12 may be removed, to limit heat leakage into the cryogenic magnet system.

The ends 14, 16 of the series of superconducting coils are connected by a diode pack 20. A similar diode pack 22 is in series with the heater R1-R6. In each of these diode packs 20, 22, two series connections of two diodes are placed in inverse parallel.

Diode pack 20 protects the cryogenic switch 18. To illustrate the protection offered by the diode pack 20, consider the situation when the magnet current is being ramped. The cryogenic switch 18 is open and a current of, for example, 500 A is flowing through 30 the coils L1-L6, the leads 12 and an associated power supply unit. If for some reason the current is interrupted, in the absence of diode pack 20, the inductance of the coils will act to force the 500 A current thorough the cryogenic switch 18. During ramp-up, this switch would be which in its open state, with a resistance in the region of 30Ω. This would generate a heat dissipation of up to 500 A*500 A*30Ω=7.5 MW, sufficient to destroy the cryogenic switch 18. In the presence of the diode pack 20, the diode pack 20 will become conductive as soon as the voltage drop across the cryogenic switch 18 exceeds a threshold voltage of the diode pack. This will occur at a relatively low voltage across the switch, before the current in the cryogenic switch 18 has risen sufficiently to cause any damage. In order to maintain the diode pack in a non-conductive state during current ramp-up of the magnet, the threshold voltage of pack 20 should be slightly higher than the ramping voltage L.dI/dt, where L is the inductance of the, magnet coils, and dI/dt is the rate of increase of the current through the magnet coils. For example, the voltage across the coils may be ramped at 10 Volts, with the current increasing accordingly.

Diode pack 22 stops the heaters R1-R6 from conducting during current ramping of the magnet coils, as its threshold voltage is selected to be greater than ramping voltage L.dI/dt. The diode pack will become conductive, allowing the heaters to function if a higher voltage develops across the magnet coils, for example during a quench.

When one of the coils L1-L6 quenches, a voltage will appear across that coil, and so also across the series connection of resistors R1-R6 and diode pack 22. This voltage rises rapidly in time, as the quench propagates within the coil. When a certain threshold voltage has been achieved, diode pack 22 will begin to conduct. A current $i_r$ starts to flow through the heaters R1-R6. These heaters will then initiate quenches locally in each coil L1-L6. By initiating quenches in all of the coils, the energy to be dissipated in the quench is spread relatively evenly across all of the coils, with the intention of avoiding any one coil heating enough to be damaged.

This arrangement has at least two drawbacks. Firstly, the voltage generated by the quench can achieve high values, causing high currents and dissipation in the heaters, which can result in the destruction of the heaters. The alternative to this would be to provide more massive heaters, or higher resistance heaters, which in turn would introduce a time delay in heating. Heaters of increased resistance would supply heat at a reduced rate, but in doing so would slow the spread of the quench, and so may increase the risk of damage to the coils. More massive heaters have a larger thermal inertia, and take a relatively long time to heat up. Ideally, the heaters are required to heat instantaneously as soon as a quench has occurred anywhere in the magnet. Secondly, the threshold voltage for operation of the heaters is determined by the forward voltage of the diode pack 22, which can be higher than desirable. This may not begin to conduct soon enough, and the risk of damage to the coils may not be fully eliminated.

The present trend is for superconducting coils to become smaller, more compact, and carrying higher currents. This increases the need for rapid quench propagation, since an increasing amount of stored energy needs to be dissipated in a decreasing volume of superconductor.

U.S. Pat. No. 5,278,380 describes inductive quench heaters for a superconducting magnet system.

SUMMARY OF THE INVENTION

The present invention addresses the drawbacks of the known quench protection system. According to the invention, a quench protection circuit for a superconducting magnet comprises at least one heater associated with a corresponding coil of the superconducting magnet. The at least one heater is arranged to be driven by an inductor which is connected in series with it and is arranged to derive a voltage from variation in a magnetic field of the superconducting magnet. The at least one heater and the inductor are arranged in a series circuit which further comprises a non-linear positive temperature coefficient resistor.

BRIEF DESCRIPTION OF THE DRAWINGS

The above, and further, objects, advantages and characteristics of the present invention will become more apparent from consideration of the following description of certain embodiments thereof, given by way of examples only, in conjunction with the accompanying drawings, wherein.

DETAILED DESCRIPTION OF THE DRAWINGS

Figure 1:
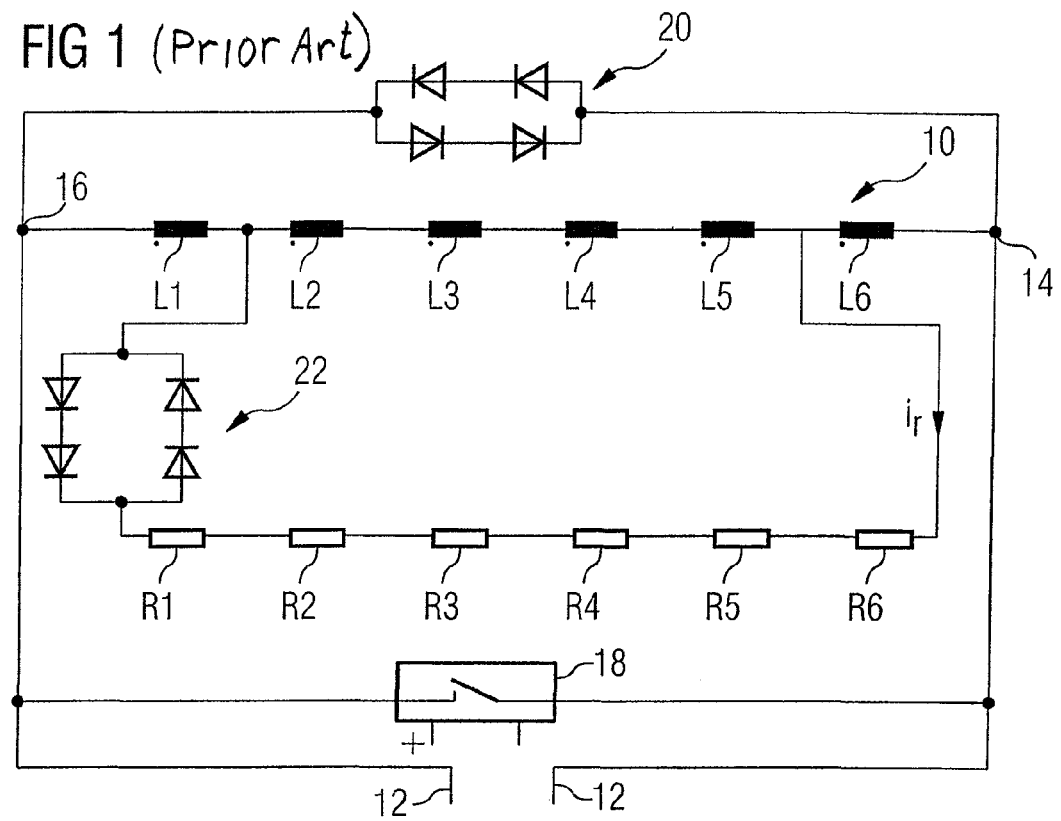
FIG. 1 shows a circuit diagram of a known quench protection circuit for a superconducting magnet.
Figure 2:
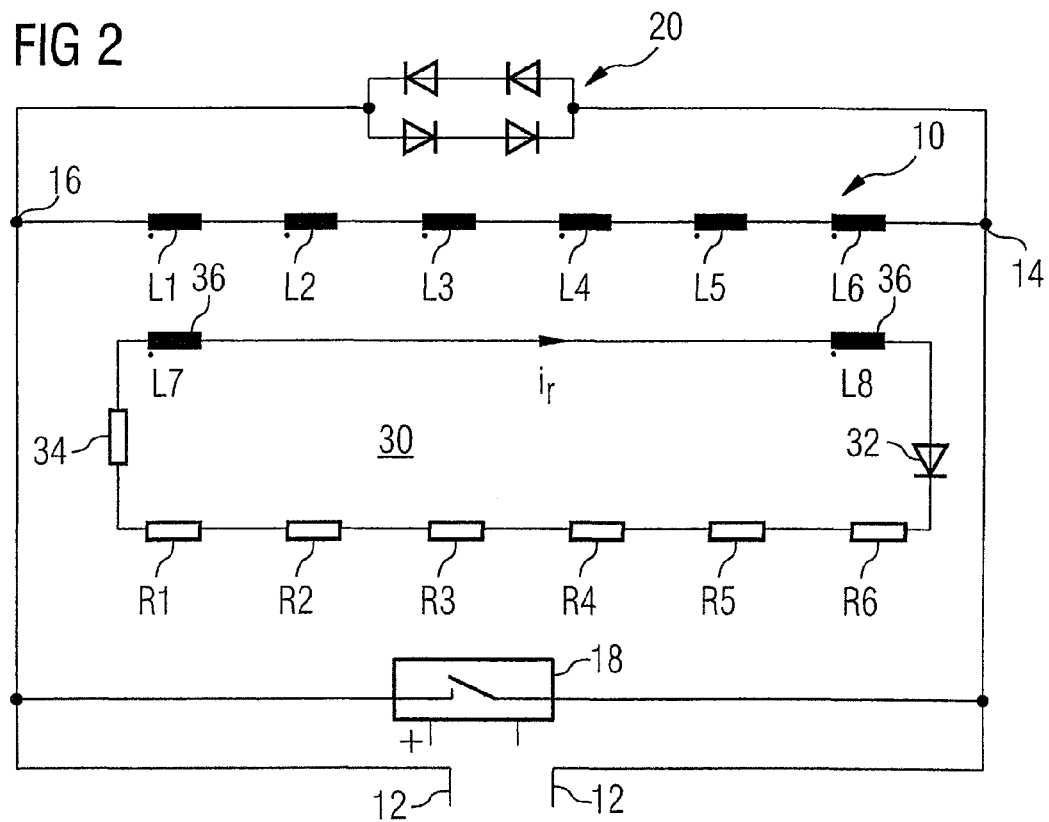
FIG. 2 shows a circuit diagram of a quench protection circuit for a superconducting magnet according to an embodiment of the present invention.

Features in FIG. 2 corresponding to features shown in FIG. 1 carry corresponding reference labels.

According to an aspect of the present invention, a heater circuit 30 is provided, which is not directly connected to the superconducting coils L1-L6. The heater circuit 30 comprises the series connection of heaters R1-R6, as in the circuit of FIG. 1. These are connected in series with a diode 32, resistive (i.e. non-superconductive) coils 36, L7 and L8, and a nonlinear resistor with a positive temperature coefficient 34. Coils L7, L8 are closely inductively coupled to the coils L1-L6. In certain embodiments, one of the coils L7, L8 may be omitted. The, or each, coil 36 is preferably located in a region of near maximum operational flux of the magnet 10. The nonlinear resistor with a positive temperature coefficient 34, may be a Metal Oxide Varistor.

An example of a Metal Oxide Varistor (MOV) is the GE-MOV® varistor, described in the Journal of Applied Physics, vol. 48, No. 4, April 1977 at page 1621.

In operation, when one of the coils L1-L6 quenches, energy will be dissipated as heat in that coil. This will result in a drop of current and magnetic flux. This change in magnetic flux will induce a voltage across coils 36. If this voltage exceeds the threshold voltage of nonlinear resistor 34, plus the forward voltage of diode 32, a current will flow through the heaters R1-R6. This will initiate quenches in all coils L1-L6. Energy will also be dissipated as heat in the nonlinear resistor 34. Since the nonlinear resistor has a positive temperature coefficient, its resistance will increase.

Due to the quench induced in all coils L1-L6, energy dissipation and rate of magnetic flux change will increase rapidly. This will cause a corresponding increase in the voltage across coils 36. Because the resistance of nonlinear resistor 34 also increases, due to the heating effect of the current $i_r$, the current $i_r$ through the heaters will not increase so rapidly. Heat will be dissipated in nonlinear resistor 34, the current $i_r$ will be held at a safe value and damage to the heaters is avoided.

An advantage in using a nonlinear resistor 34 such as a Metal Oxide Varistor (MOV) is that their temperature dependent behaviour is such that they offer effective protection of the heaters R1-R6 once the quench is under way. This offers an effective solution to one of the dilemmas of designing a quench protection circuit: that of designing a circuit which will open as soon as possible to prevent damage to the coils— this feature favouring the use of small heaters, yet which is robust enough to survive the quench, which favours large heaters. The use of nonlinear resistor 34 such as a Metal Oxide Varistor (MOV) has been found to meet both of these requirements.

The diode 32 included in the series heater circuit 30 serves to prevent activation of the heater circuit during the charging of the magnet, that is, when current injection is being performed through leads 12 to establish a current in the magnet. During this process, the current through the coils L1-L6 is increasing, and induces a voltage in resistive coil(s) 36 which is in the opposite sense from the voltage induced by a falling current in coils L1-L6 caused by a quench event. Diode D1 prevents any current $i_r$ from flowing through the heaters during current injection, as this which could otherwise cause unwanted quench. The forward voltage of diode D1 is less than the forward voltage of the diode pack 22 of FIG. 1.

The quench heater arrangement of the present invention accordingly addresses problems associated with the known arrangement of FIG. 1 in at least the following ways.

The quench heater arrangement of the present invention may be more sensitive to a quench than the known quench protection circuit. This is the case since the diode pack 22 of the prior art had a relatively high forward voltage, which delayed the start of quench heating by heaters R1-R6. In the arrangement of the present invention, the forward voltage of diode D1 is relatively low, and the threshold voltage of nonlinear resistor 34 is also relatively low. This means that the quench heaters R1-R6 begin heating sooner after the initiation of a quench, leading to a more effective quench distribution and reduced risk of damage to coils L1-L6 or heaters R1-R6.

The sensitivity of the quench circuit may be controlled by proper dimensioning of coil(s) 36. Coil(s) 36 of greater inductance would provide more rapid heating, but this would need to be matched to the heaters to provide optimal performance.

Since the resistance of the nonlinear resistor 34 increases with temperature, the initial heating of the heaters R1-R6 may be effective, since they receive most of the voltage induced across coil(s) 36, while the heaters are protected from later potentially damaging rises in the voltage across coil(s) 36 by the increased resistance of nonlinear resistor 34.

The present invention accordingly provides rapid initiation of quench heating, yet protects the heaters themselves from damage.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

The invention claimed is:

1. A quench protection circuit for a superconducting magnet, said quench protection circuit comprising:
    at least one heater associated with a corresponding coil of the superconducting magnet;
    an inductor which is inductively coupled to derive a voltage from variation in a magnetic field of the superconducting magnet, and is connected in series with the at least one heater for driving the at least one heater in response to variation in said magnetic field of the superconducting magnet; and;
    overcurrent protection means for limiting current which flows through said at least one heater in response to heating of said overcurrent protection means by said current;
    wherein said overcurrent protection means comprises a self-heating current limiting element that is arranged in a series circuit with said at least one heater and said inductor; and
    wherein said self heating current limiting element comprises a non-linear positive temperature coefficient resistor.

2. The quench protection circuit according to claim 1, herein the at least one heater is arranged in a series circuit which further comprises a diode.

3. A superconducting magnet equipped with a quench protection circuit according to claim 1.

4. An MRI system equipped with a magnet according to claim 3.

5. A method of protecting a superconducting magnet from damage during a quench event, comprising the steps of:
    inducing voltage in an inductor as a result of the variation of a magnetic field of the superconducting magnet caused by the quench event;
    passing a current resulting from the induced voltage through at least one heater associated with a corresponding coil of the superconducting magnet; and
    causing the current to flow through an overcurrent protection element that limits current flow through said at least one heater in response to heating of said overcurrent protection element by said current;
    wherein said overcurrent protection device comprises a self-heating time dependent current limiting element that is arranged in a series circuit with said at least one heater and said inductor; and
    wherein said self heating time dependent current limiting element comprises a non-linear positive temperature coefficient resistance.

6. A quench protection circuit for a superconducting magnet comprising a plurality of serially connected superconducting coils, said quench protection circuit comprising:
    a plurality of serially connected heaters, one such heater being associated with each respective coil of the plurality of superconducting coils;
    an inductor which is inductively coupled to derive a voltage from variation in a magnetic field of the superconducting magnet, and is connected in series with the plurality of heaters for driving said heaters in response to said variation in said magnetic field; and
    overcurrent protection means for limiting current which flows through said heaters in response to heating of said overcurrent protection means by said current; wherein
    said overcurrent protection means comprises a self-heating current limiting element that is arranged in a series circuit with said heaters and said inductor; and
    said self eating current limiting element comprises a non-linear positive temperature coefficient resistor.

* * * * *